(12) United States Patent
Wei et al.

(10) Patent No.: US 10,574,241 B2
(45) Date of Patent: Feb. 25, 2020

(54) DIGITAL PHASE CONTROL WITH PROGRAMMABLE TRACKING SLOPE HAVING A PROGRAMMABLE LINEAR DECODER USING A COARSE CODE AND A FINE CODE TO GENERATE DELAY ADJUSTMENTS TO THE PHASE OF AN INPUT SIGNAL

(71) Applicant: Intel Corporation, Santa Clara, CA (US)

(72) Inventors: Fangxing Wei, Folsom, CA (US); Setul M. Shah, Folsom, CA (US); Michael J. Allen, Folsom, CA (US); Khushal N. Chandan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/434,520

(22) Filed: Feb. 16, 2017

(65) Prior Publication Data
US 2017/0237444 A1     Aug. 17, 2017

Related U.S. Application Data

(63) Continuation of application No. 14/745,326, filed on Jun. 19, 2015, now Pat. No. 9,614,533.

(51) Int. Cl.
*H03L 7/081*      (2006.01)
*G11C 7/10*       (2006.01)
*G11C 7/22*       (2006.01)

(52) U.S. Cl.
CPC .......... *H03L 7/0814* (2013.01); *G11C 7/1066* (2013.01); *G11C 7/1093* (2013.01); *G11C 7/222* (2013.01); *H03L 7/0818* (2013.01)

(58) Field of Classification Search
CPC ..... G11C 7/1093; G11C 7/222; H03L 7/0814; H03L 7/0816; H03L 7/0818
(Continued)

(56) References Cited

U.S. PATENT DOCUMENTS 4,295,098 A    10/1981  Crowley
6,417,714 B1    7/2002  Biyabani et al.
(Continued)

OTHER PUBLICATIONS

International Search Report and Written Opinion for PCT Patent Application No. PCT/US2016/034862, dated Sep. 2, 2016, 14 pages.

(Continued)

*Primary Examiner* — Que Tan Le
(74) *Attorney, Agent, or Firm* — Compass IP Law PC

(57) ABSTRACT

Phase compensation in an I/O (input/output) circuit includes variable, programmable slope. A phase compensation circuit can apply phase compensation of one slope and dynamically change the slope of the phase compensation to allow for better tracking of environmental conditions. The phase compensation circuit can generate a linear code to apply phase compensation to lock phase of an I/O signal to a phase of a timing signal. The circuit selectively adjusts the linear code with a variable, programmable slope, where the slope defines how much phase compensation is applied per unit change in the linear code. The circuit applies the adjusted linear code to a lock loop to lock the phase of the I/O signal to the phase of the timing signal.

24 Claims, 5 Drawing Sheets

(58) Field of Classification Search
USPC .......................................... 250/214 R, 231.13
See application file for complete search history.

(56) References Cited

U.S. PATENT DOCUMENTS

| | | | |
|---|---|---|---|
| 6,917,229 | B2 | 7/2005 | Cho |
| 7,242,229 | B1 | 7/2007 | Starr et al. |
| 7,271,634 | B1 | 9/2007 | Daga et al. |
| 8,093,937 | B2 | 1/2012 | Kwak et al. |
| 8,737,162 | B2 | 5/2014 | Ware et al. |
| 2002/0075047 | A1 | 6/2002 | Tsukikawa |
| 2009/0322392 | A1 | 12/2009 | Miyamoto |
| 2010/0052751 | A1 | 3/2010 | Abe |
| 2011/0204942 | A1 | 8/2011 | Abe et al. |
| 2012/0243353 | A1 | 9/2012 | Romanovskyy |
| 2012/0249200 | A1 | 10/2012 | Yu |
| 2013/0159657 | A1 | 6/2013 | Zerbe et al. |
| 2013/0229214 | A1 | 9/2013 | Ichida |
| 2014/0068316 | A1* | 3/2014 | Hashimoto ............... G06F 1/08 713/601 |
| 2014/0084977 | A1 | 3/2014 | Vlasenko et al. |

OTHER PUBLICATIONS

Extended European Search Report for Patent Application No. 16812131.7, dated Feb. 26, 2019, 8 pages.

\* cited by examiner

DIGITAL PHASE CONTROL WITH PROGRAMMABLE TRACKING SLOPE HAVING A PROGRAMMABLE LINEAR DECODER USING A COARSE CODE AND A FINE CODE TO GENERATE DELAY ADJUSTMENTS TO THE PHASE OF AN INPUT SIGNAL

PRIORITY

The present application is a Continuation of, and claims the benefit of priority of, U.S. patent application Ser. No. 14/745,326, filed Jun. 19, 2015.

FIELD

Embodiments of the invention are generally related to digital input/output (I/O) circuits, and more particularly to a phase control loop with programmable tracking slope.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright ©2015, Intel Corporation, All Rights Reserved.

BACKGROUND

Inter-device I/O (input/output) allows different system components to communicate to each other for operation of computing systems. Computing systems are used in any of a very wide array of consumer and commercial devices. Computing systems include memory subsystems to store and provide access to code and data executed by a processor of the computing system. I/O is important in memory subsystems to allow the transfer of data between the processor and the memory resources that store the code and data.

Specific memory technologies have standards that apply to timing associated with I/O that devices must meet to be considered compliant. DDR (double data rate) memory I/O systems provide phase compensation to lock a data signal with a clock or timing signal. One example of DDR I/O phase compensation is the use of a DLL (delay locked loop) that provides a variable amount of delay into a clock edge to adjust the timing of the clock signal. The amount of phase compensation per adjustment (often referred to in industry as "step size") controls how quickly or slowly the DLL can lock on the correct phase timing. In one DDR implementation, there is a DLL lock specification that requires the DLL to lock within a specified number of clock cycles.

There is a tradeoff in the amount of phase compensation per adjustment: finer adjustments allow more precise locking, which improves signal quality, while coarser adjustments allow the DLL to lock within specification timing requirements. In a memory subsystem that is powered by a power supply with a lot of noise, finer adjustments can be lost in the noise, which can prevent the DLL from even "catching up" to the proper phase and obtaining a lock. Thus, there are advantages and disadvantages to both coarser phase adjustment size and finer phase adjustment size.

In addition to the limitations on phase adjustment size, traditional memory subsystem I/O designs also experience errors introduced by the lock position search mechanism. Most current digital DLL designs use a shift register design as the phase controller, and use binary search to determine the lock position. The binary search based on the shift register design can cause harmonic lock (locking on a harmonic instead of on the primary phase of the clock signal). The shift register state machine controller design is very complicated, which adds to overall system complexity and cost. The binary search is typically inflexible for tracking under noisy conditions.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
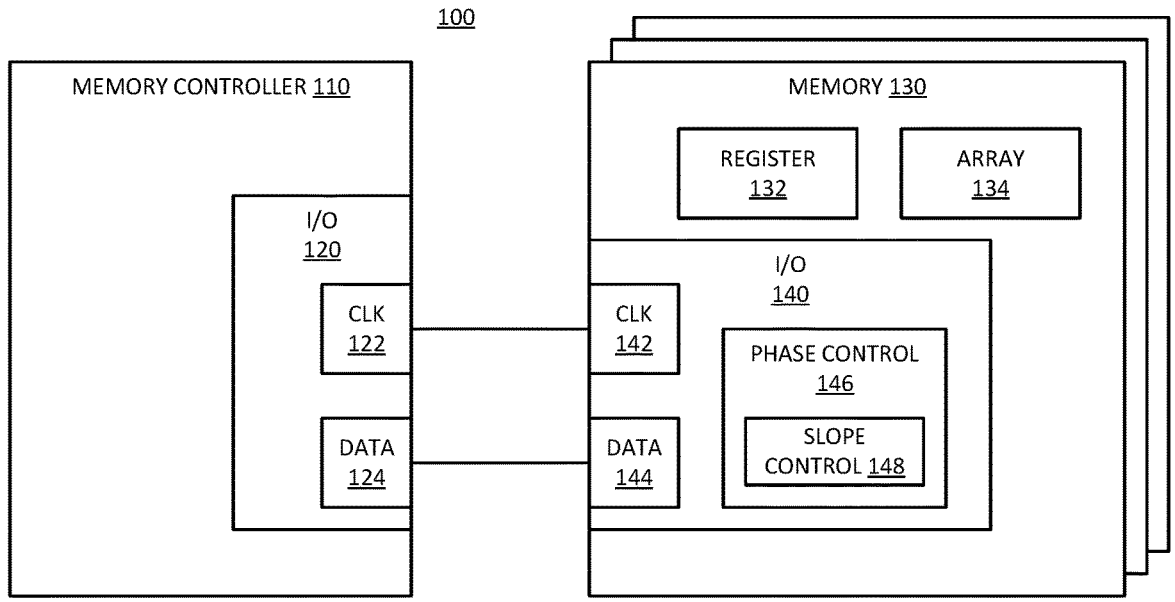
FIG. 1 is an embodiment of a block diagram of a system that applies phase control for an I/O signal exchanged between two devices, including phase slope control.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, phase compensation in an I/O (input/output) circuit includes variable, programmable slope. The phase compensation is applied from a linear controller that can apply phase compensation of one slope and dynamically change the slope of the phase compensation to allow for better tracking of environmental conditions. The phase compensation circuit can generate a linear code to apply phase compensation to lock phase of an I/O signal to a phase of a timing signal. The circuit selectively adjusts the linear code with a variable, programmable slope, where the slope defines the phase compensation size or how much phase compensation is applied per unit change in the linear code. The circuit applies the adjusted linear code to a lock loop to lock the phase of the I/O signal to the phase of the timing signal.

With a variable, programmable phase adjustment slope, the lock circuit can provide faster locking to provide coarse phase compensation quickly, and slower tracking to improve locking precision and reduce tracking jitter. By employing such phase compensation, a DLL can lock within the specified number of clock cycles for certain DDR (dual data rate) I/O requirements. Because the phase adjustment is programmable, the DLL or other phase compensation circuit can adjust operation for different environmental conditions, such as power supply noise or other noise at different amplitudes and frequencies. Thus, in one embodiment, the phase compensation can react to changing environmental conditions by changing the tracking slope.

In one embodiment, the phase compensation circuit employs a parallel phase compensation system, with a coarse lock and a fine lock. The phase compensation can generate separate coarse code and fine code to control the different locking/tracking mechanisms. The phase compensation circuit can find a coarse lock by sweeping the coarse code until a feedback signal indicates the adjusted clock edge crosses a reference clock edge. In one embodiment, the phase compensation circuit saves the coarse lock code to a storage device, and then triggers slow tracking with a finer phase adjustment size. After locking on the phase with the fine phase adjustments, the system can continue to track changes in the environmental conditions (e.g., temperature change, power supply noise induced change) with the fine phase adjustments. If the feedback indicates that the lock is getting lost, the system can revert to coarse phase adjustments.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), WIO3 (Wide I/O 3, currently in discussion by JEDEC), HBM2 (HBM version 2), currently in discussion by JEDEC), and/or others, and technologies based on derivatives or extensions of such specifications. In addition to the I/O for memory devices, the phase compensation techniques can be applied to other inter-device communication where phase compensation can be used to align a command or data signal to a clock signal.

FIG. 1 is an embodiment of a block diagram of a system that applies phase control for an I/O signal exchanged between two devices, including phase slope control. System 100 provides one example of a memory subsystem having I/O phase control that provides programmable, variable slope control for phase compensation. Memory 130 represents memory resources in system 100. For example, each memory device can be a DRAM device. Memory array 134 includes cells or addressable locations that store bits of data. Memory array 134 represents the memory resources where data is stored in response to a Write command and accessed in response to a Read command. Memory 130 and the storage locations in array 134 can be organized as channels, ranks, banks, DIMMs (dual inline memory modules), and/or other ways to manage the memory addressing and accessing.

Memory controller 110 represents a circuit or control logic to control access to memory 130. Memory controller 110 can be implemented as a discrete device, as a circuit that is part of a primary processor, or as a chip integrated into a system on a chip. In one embodiment, memory controller 110 is part of a central processing unit (not shown) that provides host processing control for a computing system in which system 100 is a part. There is commonly one memory controller per channel of memory; thus, there can be one or more independent memory controllers in a host system.

Memory controller 110 includes I/O 120 to communicate with chips or other devices external to the memory controller device. For example, memory controller 110 communicates with memory 130 via I/O 120. Memory 130 includes I/O 140 to connect to the signal lines that provide the electrical or signaling interface between memory controller 110 and memory 130. I/O 120 can include a command/address (C/A) interface (not specifically shown) to enable memory controller 110 to provide commands and control signals to memory 130. I/O 140 of memory 130 can include a corresponding C/A interface to receive the commands and control signals.

In one embodiment, I/O 120 includes clock (CLK) interface 122 and a data interface 124. I/O 140 includes corresponding interfaces clock 142 and data 144. The clock interface can enable the memory controller to provide a timing signal or clock signal for memory 130 to receive and send data. Thus, memory 130 can be aligned with the timing of the data transmitted to and from memory controller 110 so both devices can synchronize I/O. The data interface enables memory controller 110 to send data to memory 130 for a write transaction, and for memory 130 to send data to memory controller for a read transaction. In one embodiment, memory controller 110 and memory 130 exchange data based on signals that need phase compensation to ensure proper signaling margining. In one embodiment, memory controller 110 includes phase control (not specifically shown).

In one embodiment, memory 130 includes one or more registers 132, which can represent mode registers of other storage devices that store configuration settings or operating settings with respect to I/O. In one embodiment, register 132 stores one or more codes related to I/O phase compensation slope. In one embodiment, register 132 determines what slope of phase compensation will be used to lock the I/O phase. In one embodiment, memory 130 includes phase control 146 to align signals on data interface 144 with the clock signal on clock 142. Phase control 146 operates based on values stored in register 132 or the equivalent.

Thus, phase control 146 represents logic within memory 130 to provide phase adjustment to align communication via data interface 144 with the clock signal. In one embodiment, phase control 146 includes logic within an internal controller of memory 130. The controller internal to memory 130 controls the timing and internal commands to execute operations to execute the commands provided by memory controller 110. In one embodiment, phase control 146 includes a lock loop, such as a digital delay locked loop (DLL) or phase locked loop (PLL), to provide phase compensation. Phase control 146 can adjust timing for noise and drift and other conditions that can cause an offset between the data edges and the clock edges. Phase control 146 can operate in accordance with any embodiment of phase control described herein. Phase control 146 includes slope control 148 to enable the phase control to program phase compensation with different phase adjustment sizes.

In one embodiment, phase control 146 can find a coarse lock by sweeping a DLL coarse code for a coarse delay chain until a DLL feedback clock edge crosses a DLL reference clock edge. In one embodiment, phase control 146 can then save the coarse lock code to a storage device (such as register 132 or other storage within memory 130), and then place the DLL into slow tracking mode. In one embodiment, phase control 146 reloads the saved DLL coarse lock code and, via slope control 148, triggers the DLL to operate in fine tracking with a different phase adjustment size (a different slope).

Figure 2:
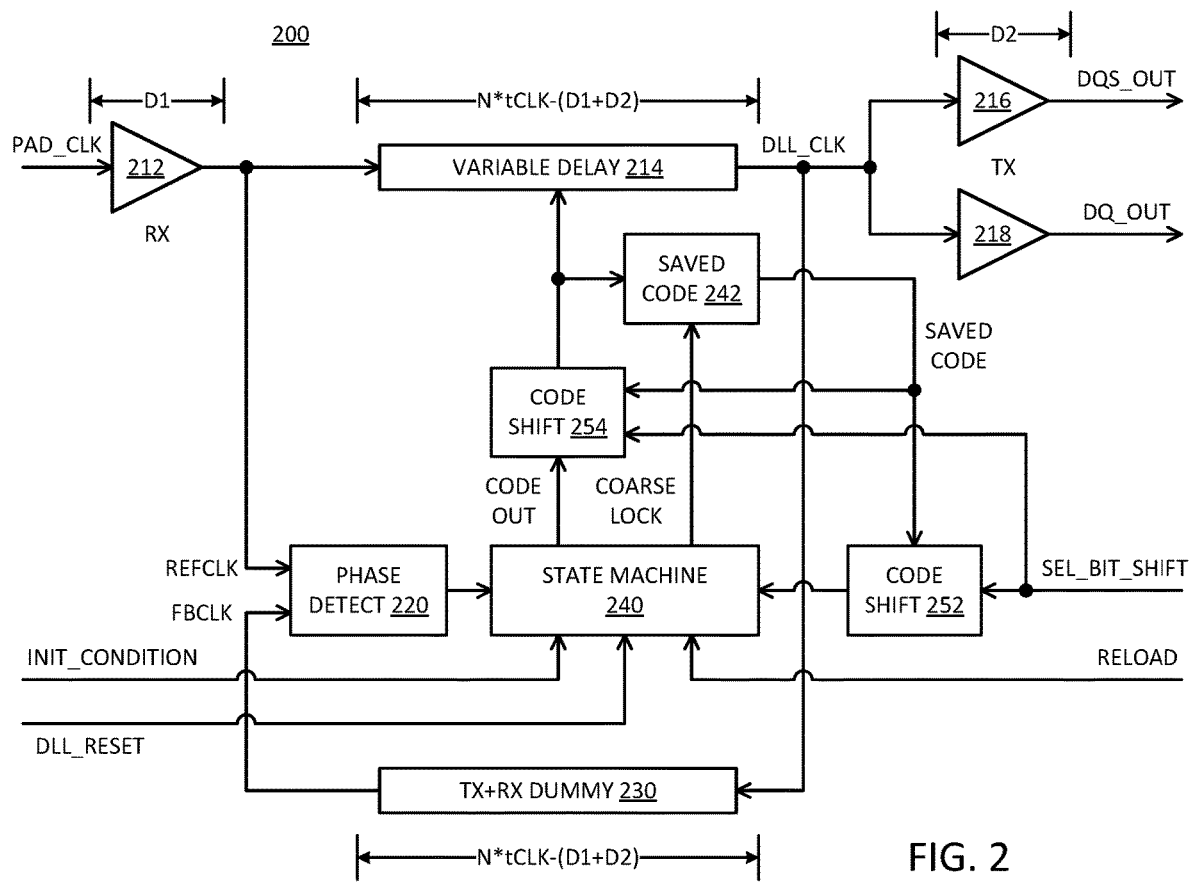
FIG. 2 is an embodiment of a block diagram of a system that generates phase compensation control with a programmable slope.

FIG. 2 is an embodiment of a block diagram of a system that generates phase compensation control with a programmable slope. Circuit 200 provides one example of a phase compensation circuit in accordance with an embodiment of phase control 146 of system 100. Circuit 200 can also be referred to as an I/O control circuit, because it controls the phase of the clock used for I/O. Circuit 200 receives a clock input, identified as PAD_CLK or pad clock. The pad clock signal is a clock or synchronization signal provided to the memory subsystem that includes circuit 200. It will be understood that while described in terms of a memory device or memory subsystem, circuit 200 can be included in any I/O interface between devices where a clock signal accompanies the exchange of a data or information signal. Thus, embodiments of the invention are not limited to memory devices.

Pad clock is an input into the I/O circuit, and is buffered at RX buffer 212. The input can be received, for example, at a pin or pad or other input hardware of circuit 200. There is a delay of D1 in receiving the clock signal. Circuit 200 adjusts the input clock signal with variable delay 214. In one embodiment, variable delay 214 is provided by a phase compensation circuit, or represents a part of a phase compensation circuit. In one embodiment, circuit 200 provides variable delay with a parallel type phase compensation, with a coarse delay chain and a fine delay mixer. Such a circuit can be in accordance with any embodiment described in co-filed U.S. patent application Ser. No. 14/745,321, now U.S. Pat. No. 9,455,726, having common inventorship, and filed concurrently herewith. Certain details of a state machine and delay circuit are provided below with respect to FIGS. 4 and 5.

Variable delay 214 introduces a variable, programmable amount of delay into the input clock to lock a data signal with the clock. The delayed clock provides input to transmit buffers 216 and 218 for DQS_OUT and DQ_OUT, respectively. The delayed clock is identified as DLL_CLK in circuit 200. The DQS_OUT and DQ_OUT signals are for data strobe and data signals. The pad clock can be received on a signal line connecting to circuit 200. The DQ outputs at 216 and 218 can be for data signals also transmitted over I/O signal lines. The data signals received at the I/O input clock can be phase locked to the clock signal via circuit 200, which applies phase compensation to lock phase of the I/O signals to a phase of a timing or clock signal.

The delay for the output is D2. The time through variable delay is illustrated as N*tCLK−(D1+D2), or the number of clock cycles minus the RX and TX delays. In one embodiment, variable delay 214 does not change the period of the input clock, but changes the triggering edge (e.g., the rising edge) of the clock signal to account for noise, temperature change, and/or other environmental conditions that can cause signal drift. The output of variable delay 214 can be fed back to TX+RX dummy 230, which represents a matched or delay-equivalent path as the path from buffer 212 to buffers 216 and 218. Thus, dummy route 230 has identical delay of N*tCLK−(D1+D2). Thus, the signal can be fed back as feedback (FBCLK) into phase detector 220 along with the original received clock (REFCLK or reference clock) to determine an offset between the clock signals.

As already mentioned, phase detect 220 can receive the input clock as a reference clock, and the previous cycle with variable delay 214 applied as a feedback clock. Phase detect 220 can detect an offset between the clocks and provide an input to state machine 240 to determine what state the system is in, and how to apply phase compensation to the clock. State machine 240 represents the control logic of the phase compensation. State machine 240 can be a separate controller on a device, or can be part of an existing controller. In one embodiment, the controller that manages the timing and operations for I/O within a chip or device includes control elements of circuit 200.

In one embodiment, state machine 240 includes a linear up/down counter. In one embodiment, state machine 240 can include a loadable counter. State machine 240 provides linear control to generate variable delay 214. The linear control is generated from code used to control variable delay 214. In one embodiment, state machine 240 includes a linear counter that generates a count used to produce the control code to control variable delay 214. In a parallel phase compensation circuit, circuit 200 can include a DLL delay chain with an upper section for coarse delay compensation, and a lower section for fine delay mixing. Such a compensation circuit can be included in state machine 240.

State machine 240 can receive an initial condition input (INIT_CONDITION). The initial condition input represents one or more settings that set a starting point for phase compensation operation by circuit 200. In one embodiment, initial conditions can be configured by writing one or more values to a register (such as register 132 of system 100). In one embodiment, initial conditions can be configured to place the operation of the state machine in a "middle" of its range of operation. Thus, the state machine can begin with an offset to allow room to adjust up or down, depending on the environmental conditions detected. Circuit 200 can initiate locking operation from an identified preset value starting point for the phase compensation, and adjust the linear code used to perform the locking based on initial conditions.

State machine 240 can receive a reset input, identified as DLL_RESET. The reset input triggers the initiation of operation of circuit 200. If the circuit has been operating, current values can be reset, and the circuit will return to initial conditions. The reset condition can occur on power up, exit from power save mode, or other times when the I/O is powered following a powered down or low power state. In one embodiment, after the reset signal is de-asserted (it could occur on assertion in an alternate embodiment), circuit 200 starts a fast locking process. During fast locking, the counter can count the coarse code up until a coarse lock is obtained. In one embodiment, a coarse lock is identified when the feedback clock edge (FBCLK) crosses the reference clock edge (REFCLK). In one embodiment, phase detect 220 includes a comparator that outputs a signal when the feedback clock edge crosses the reference clock. Such clock crossing will occur when the coarse code first "catches" the clock signal.

In one embodiment, once the coarse lock is obtained, state machine 240 triggers a fine delay lock to obtain a more precise fix on the signal. In one embodiment, circuit 200 includes one or more code shift blocks 252, 254 that affect the slope of the linear locking code. In one embodiment, code shifts 252, 254 can be considered to program the slope or the amount of phase compensation per unit phase adjustment. In one embodiment, code shifts 252, 254 operate as an adjustment to the coarse code. For example, they can shift not at all (i.e., keeping the same slope as the coarse code), or perform a binary division of the coarse code to generate a different slope (e.g., dividing the coarse code by 1, 2, 4, 8, . . . ). The amount of shift or binary division (e.g., by shifting out LSBs from the coarse code to divide it down) can be programmed or selected by a select bit identified as SEL_BIT_SHIFT. In one embodiment, the select bit is stored in a register, and is determined from a validation sequence. In the validation sequence, the system can performance one or more I/O tests to determine environmental conditions (e.g., voltage, temperature, noise) that can affect the I/O. Based on the environmental conditions, the system can determine (e.g., via a processor computing a heuristic algorithm) how much slope will allow circuit 200 to track the noise while providing desired precision (e.g., as measured by determining error performance).

In one embodiment, code shift 254 is located between the counter of state machine 240 and a delay chain in variable delay 214. Thus, code shift 254 can shift a counter output (CODE OUT) to the proper bus position to control coarse delay. In one embodiment, during fast locking, the fine delay mixing code comes from the initial condition (such as a stored or saved value from a previous fine delay mixing search). In one embodiment, after a coarse lock is flagged by phase detect 220, circuit 200 stores the coarse code that resulted in the lock in saved code 242. Saved code 242 represents a storage (e.g., a register or a location in a memory) that keeps the coarse lock code.

After obtaining a coarse lock, state machine 240 can exit fast locking and execute a slow tracking mode. The slow tracking can be done with a shifted version of saved code 242, which is fed back into code shifts 252, 254. To track with 1 fine adjustments per loop, circuit 200 can load the entire saved coarse lock delay code (saved code 242) into the counter of state machine 240 (via code shift 252) to perform a single fine up/down tracking. To track with 2 fine adjustments per loop, SEL_BIT_SHIFT can shift saved code 242 by one bit, dropping the LSB, and reloading the rest of the saved coarse lock delay code into the counter for up/down tracking. Similarly, 4 fine adjustments and 8 fine adjustments can be achieved by dropping more bits from the coarse lock delay code (via code shift 252, 254). In one embodiment, the reload signal input to state machine 240 triggers the reloading of the code from code shift 254 and/or from an initial condition (depending on the state of state machine 240).

It will be understood that circuit 200 illustrates one way to adjust the slope of the linear delay code used for tracking. It will be understood that with a larger slope (more phase adjustment per unit change), circuit 200 can lock faster, and with a smaller slop (less phase adjustment per unit change), circuit 200 will lock slower but track with smaller tracking jitter. With programmable slopes, circuit 200 can track to different environmental conditions, such as a noisy power supply with different noise amplitude and noise frequency.

The simple linear state machine and control of circuit 200 is contrasted with the typical DLL design, which uses a shift register as a controller, and uses binary searching to determine a lock position. Such a traditional approach can cause harmonic lock. Circuit 200 includes state machine 240, which uses a linear lock search from minimum code, which can avoid harmonic lock. Circuit 200 also allows programmable slopes, which can provide fast locking as provided by traditional designs, but offer better flexibility to track under noisy conditions. Additionally, state machine 240 can be much simple than existing DLL state machines. Circuit 200 can provide reduced power consumption relative to traditional DLL designs due to the simpler circuitry.

Figure 3:
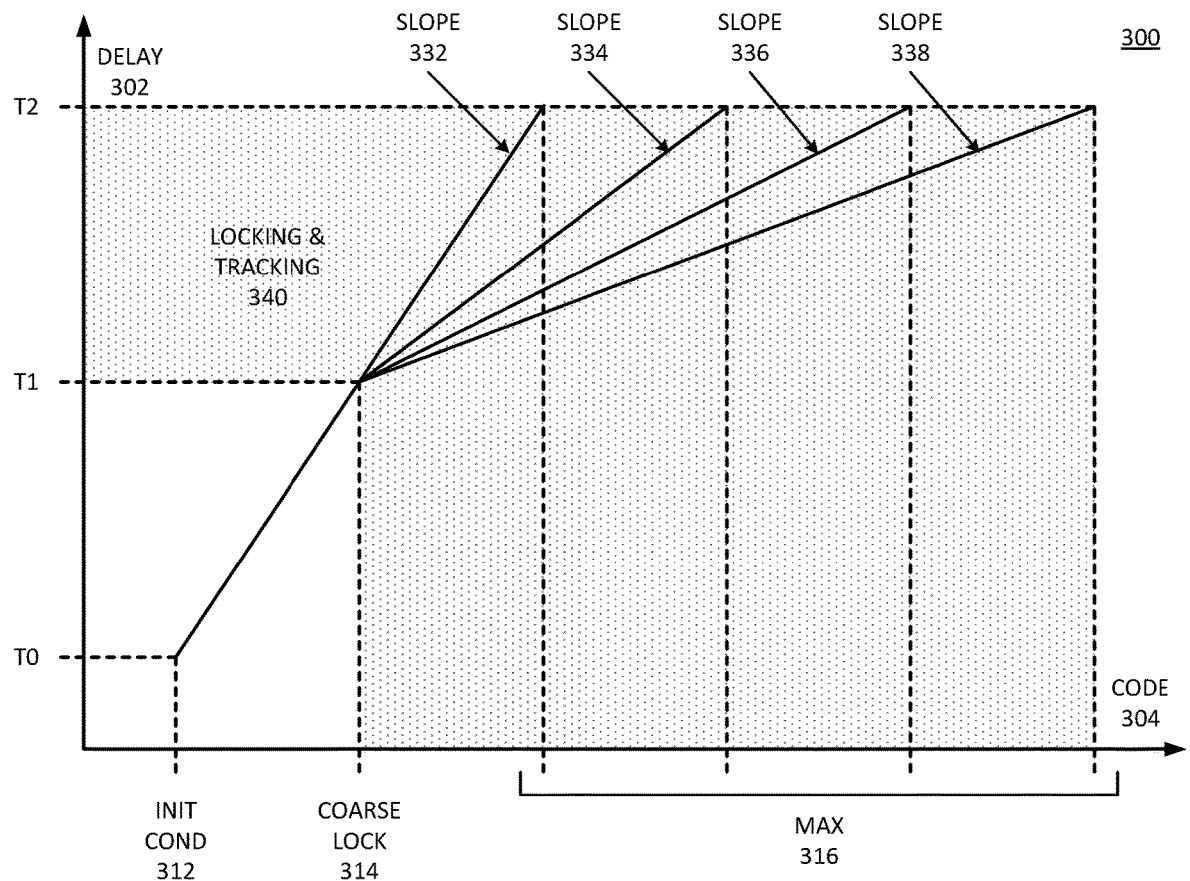
FIG. 3 is a diagrammatic representation of an embodiment of phase locking based on a programmable slope.

FIG. 3 is a diagrammatic representation of an embodiment of phase locking based on a programmable slope. Diagram 300 provides an illustration of how applying programmable slopes causes a state machine to cycle through more delay code to read the same amount of delay. Delay axis 302 is plotted against code axis 304. Delay 302 represents how much delay is introduced into the phase compensation. Code 304 represents how much code or how many cycles through the code would be required to achieve the delay of axis 302. The delay chain delay can be provided quicker with less control code in fast lock or coarse locking, and then more slowly adjusts with finer delay.

Initial condition 312 represents a starting point for the phase compensation circuit, which can be a minimum delay expected for the system. Thus, the initial condition is identified with a time T0. When PVT (process, voltage, temperature) changes, the DLL or other phase compensation circuit has enough delay margin to track up and down. The phase compensation circuit begins to operate, and begins coarse lock or fast lock (between initial condition 312 and coarse lock 314). In coarse locking, in one embodiment, a DLL counter sweeps up the coarse code for a DLL delay chain until a DLL feedback clock edge crosses a DLL reference clock edge. When coarse lock 314 is reached at time T1, the phase compensation can change to locking and tracking 340, represented by the shaded area.

The slow locking and tracking 340 is between coarse lock 314 and maximum reached (max) 316. In slow locking and tracking 340, in one embodiment, the DLL counter can sweep up or down full or partial fine delay mixing control to track DLL delay variations. For example, the delay variations can be tracked according to a DLL phase detector up/down detection. In one embodiment, the phase compensation can cause the DLL counter to count either full DLL fine delay mixing code or partial code depending on the tracking slope programmed. The maximum point of 316 represents when a delay of T2 is reached. It will be observed that different slopes, 332, 334, 336, and 338 take more code to reach the same amount of delay. It will be observed that slope 332 matches the slope of the coarse locking. In one embodiment, each of slopes 332, 334, 336, and 338 are binary divisions of the coarse delay code, with slope 332 being the coarse delay code divided by 1. Thus, each of the fine delay phase adjustments can be a subdivision of the coarse delay phase adjustment.

Figure 4:
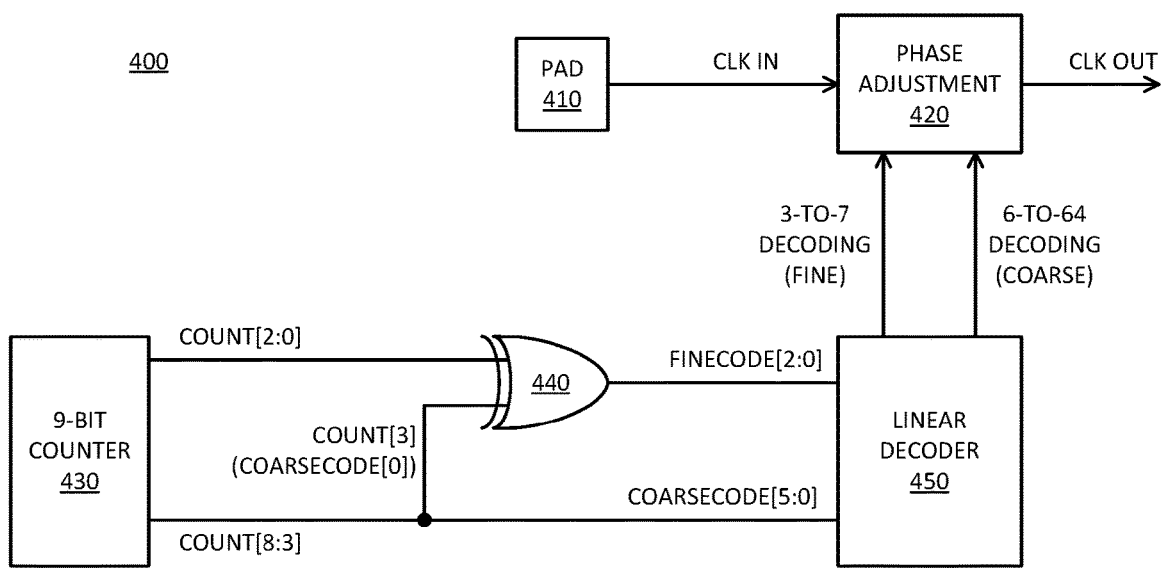
FIG. 4 is an embodiment of a block diagram of a system in which phase control includes coarse control and fine control that is XORed to generate a triangular control feature, which can provide phase control of varying slope.

FIG. 4 is an embodiment of a block diagram of a system in which phase control includes coarse control and fine control that is XORed to generate a triangular control feature, which can provide phase control of varying slope. In one embodiment, system 400 is one example of phase control for system 100 and/or the state machine of system 200. System 400 can provide phase control for a DLL or PLL for inter-device I/O. In one embodiment, the different slopes of diagram 300 are provided by a state machine that provides phase compensation control to a DLL. In one embodiment, system 400 represents such a state machine. In one embodiment, system 400 can provide variable, programmable slope for the phase compensation.

In one embodiment, system 400 receives a clock in signal (CLK IN) from pad 410. Pad 410 represents any type of physical connector to an external interface. In one embodiment CLK IN is an input clock signal received from the device sending a signal for processing (such as a data signal). Phase adjustment 420 represents logic and/or circuitry to provide one or more adjustments to the phase of the CLK IN signal to generate the clock out signal (CLK OUT). CLK OUT is phase adjusted to the data to time the sampling and signaling when the data signal is most likely to be processed correctly. In one embodiment, phase adjustment 420 represents multiple adjustment circuits, such as a coarse delay adjustment and a fine delay adjustment.

In one embodiment, system 400 provides triangular delay control for at least some portion of phase adjustment 420. In one embodiment, system 400 provides triangular phase control for fine delay mixing. Counter 430 represents a simple, linear up/down counter. For purposes of example, counter 430 is illustrated specifically as a 9 bit counter, but could be any number (N) of bits that will provide the control desired for the specific implementation of the phase control. As illustrated, part of the count from counter 430 is routed to control coarse phase adjustment, and part of the count is routed to control fine phase adjustment. It will be understood that reference to the "lower portion" of the count refers to the portion of the count that changes most frequently, or the least significant bits (the least significant M bits [(M−1):0]). The "upper portion" of the count refers to the other portion of the count, or the more significant bits (the most significant (N−M) bits [(N−1):M]).

System 400 routes the lower portion the counter output bits to control the fine delay mixing. As illustrated, in one embodiment, the upper six bits of the output of counter 430, count[8:3], are routed to control the coarse delay. Count[8:3] becomes coarsecode[5:0] as input for linear decoder 450. In one embodiment, coarsecode[5:0] provides control of a coarse delay chain even/odd output selection. It will be understood that a different number of bits can be used for fine delay mixing, depending on the design of the control system and the delay circuits. In one embodiment, linear decoder 450 performs a two-bit hot binary decode operation to select even/odd clocks out from a coarse delay chain that is part of phase adjustment 420.

In one embodiment, the lower three bits of the output of counter 430, count[2:0], are routed to control the fine delay mixing. The lower bits are not passed directly through for fine delay control. Rather, system 400 provides a bitwise XOR of count[2:0] with the LSB of the coarse delay control. It will be understood that the LSB of the coarse code delay control can be referred to as coarsecode[0], which is the same as count[3]. XOR circuit 440 performs the bitwise XOR operation and changes count[2:0] to finecode[2:0] or the fine delay code. In one embodiment, linear decoder 450 receives finecode[2:0] to control fine delay mixing in a phase interpolator unit of phase adjustment 420. It will be understood that linear decoder 450 can include more than one circuit, and does not necessarily perform the same decoding operation on the fine delay code and the coarse delay code. It will be understood that system 400 provides more direct control of the delay mixing based on the application of the XORed fine code delay bits, as contrasted to the indirect control traditionally applied through a complex state machine.

The upper and lower portions are not necessarily the same number of bits, although they could be. In one embodiment, XOR circuit 440 performs a bitwise XOR operation of the LSB (least significant bit) of the coarse delay code to control the fine delay code. Thus, the XOR circuit can include multiple XOR gates. When the LSB of the coarse code is 0, the bitwise XOR operation will result in passing the lower portion of the count as it is, generating a fine code that counts up as the counter increments. It will be understood that when the fine code reaches its upper limit and overflows, the LSB of the coarse code will transition to 1 because the LSB of the coarse code is the overflow bit for the fine code. When the LSB of the coarse code is 1, the bitwise XOR operation will result in inverting the lower portion of the count, resulting in a fine code that starts at its peak value and decrements as the counter increments. It will be understood that the same result can be achieved by using a decrementing counter. Thus, the count from the counter can continue in the same direction the entire time, but will result in the fine code repeatedly, continuously counting from zero to its maximum ($2^M-1$), from its maximum to zero, and back up to its maximum.

In one embodiment, decoder 450 generates fine delay mixing control as a 3-to-7 decoding. Thus, the three bits of finecode[2:0] are converted to 7 bits of control (for example, as explained below with respect to FIG. 5). In one embodiment, the fine delay control of system 400 as illustrated counts continuously from 0 to 7 to 0, in a repeated cycle. In binary, the count starts at '000xB' and counts up until it reaches '111xB', and then it counts from '111xB' back down to '000xB'. In one embodiment, decoder 450 generates 64 bits of coarse delay control from the six bits of coarsecode [5:0] (i.e., 6-to-64 decoding). It will be understood that the number of bits needed for coarse control depends on the length of the coarse delay chain, and chains of binary lengths other than 64 can be used.

In one embodiment, linear decoder 450 includes additional inputs from what is shown in system 400. Such additional input can enable linear decoder 450 to generate code of different slopes, based on a code shift block (which can be understood to be within linear decoder 450 for purposes of system 400). Such a code shift block can enable system 400 to perform a binary division of coarse code [5:0] to reduce the slope of phase adjustment per unit change. The slope control can be executed in response to various environmental conditions detected in the system. In one embodiment, linear decoder 450 provides fine delay mixing control from a divided-down coarse code, rather than a separate input. Such a fine delay code can provide variable programmable slope to lock the phase of the clock.

Figure 5:
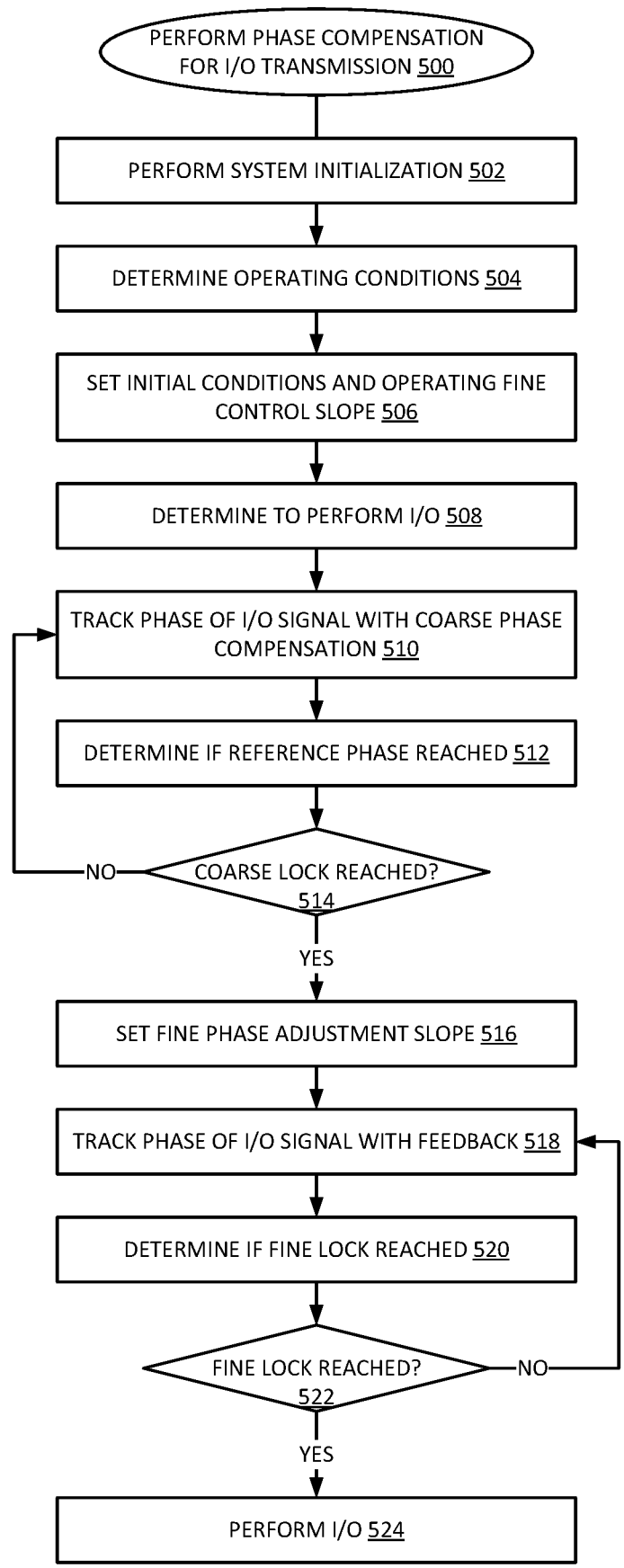
FIG. 5 is a flow diagram of an embodiment of a process for generating linear phase control with varying compensation slope.

FIG. 5 is a flow diagram of an embodiment of a process for generating linear phase control with varying compensation slope. Process 500 provides an example of an embodiment of performing phase compensation for I/O transmission with variable, programmable slope of phase compensation. In one embodiment, a device with I/O phase compensation performs system initialization to determine what environmental conditions (e.g., PVT) exist in the system implementation, and determine what settings of I/O phase control will provide best performance and phase matching, 502. The system can preset one or more settings related to the conditions as initial conditions for operation of the I/O phase control.

In one embodiment, a device requests I/O with another device, and determines operating conditions for the I/O signal, 504. Such a determination can be indirect, such as via a feedback mechanism or reading settings from a storage. In one embodiment, the I/O phase compensation sets initial conditions and determines what settings to use for coarse delay locking and fine delay locking, 506. The fine delay locking can be set to one of multiple different slopes.

A device either receives or generates a command to perform I/O with another device, 508. The I/O can be receiving an input signal or generating an output signal. The device includes an I/O control circuit, such as a microcontroller that manages the I/O. The controller configures the I/O for exchanging with the other device. In one embodiment, configuring the I/O include triggering delay control to adjust the phase of the I/O signal to align with a clock signal. In one embodiment, the phase control tracks the phase of the I/O signal with coarse phase compensation, 510. In one embodiment, a state machine or controller that controls the phase compensation determines if the coarse adjustment has reached a reference phase, 512.

If the coarse lock is not reached, 514 NO branch, the coarse lock continues. If the coarse lock is reached, 514 YES branch, in one embodiment, the phase control enters a slow locking mode and sets the fine delay phase adjustment slope for the fine delay adjustments, 516. In one embodiment, the phase control selectively adjusts a linear code with a variable, programmable slope for the fine delay tracking. The slope defines how much phase compensation is applied per unit change in the linear code. In one embodiment, the phase control can initially apply a coarse code for phase adjustment and change slope from the coarse code to a subdivision of the coarse code adjustment into finer adjustments.

The control circuit can track the phase of the I/O signal in the slow tracking with feedback, 518, and determine if the fine lock is reached, 520. If fine lock has not been reached, 522 NO branch, the phase control continues to track and lock with the fine delay. When fine lock is reached, 522 YES branch, the device can perform the I/O, 524.

Figure 6:
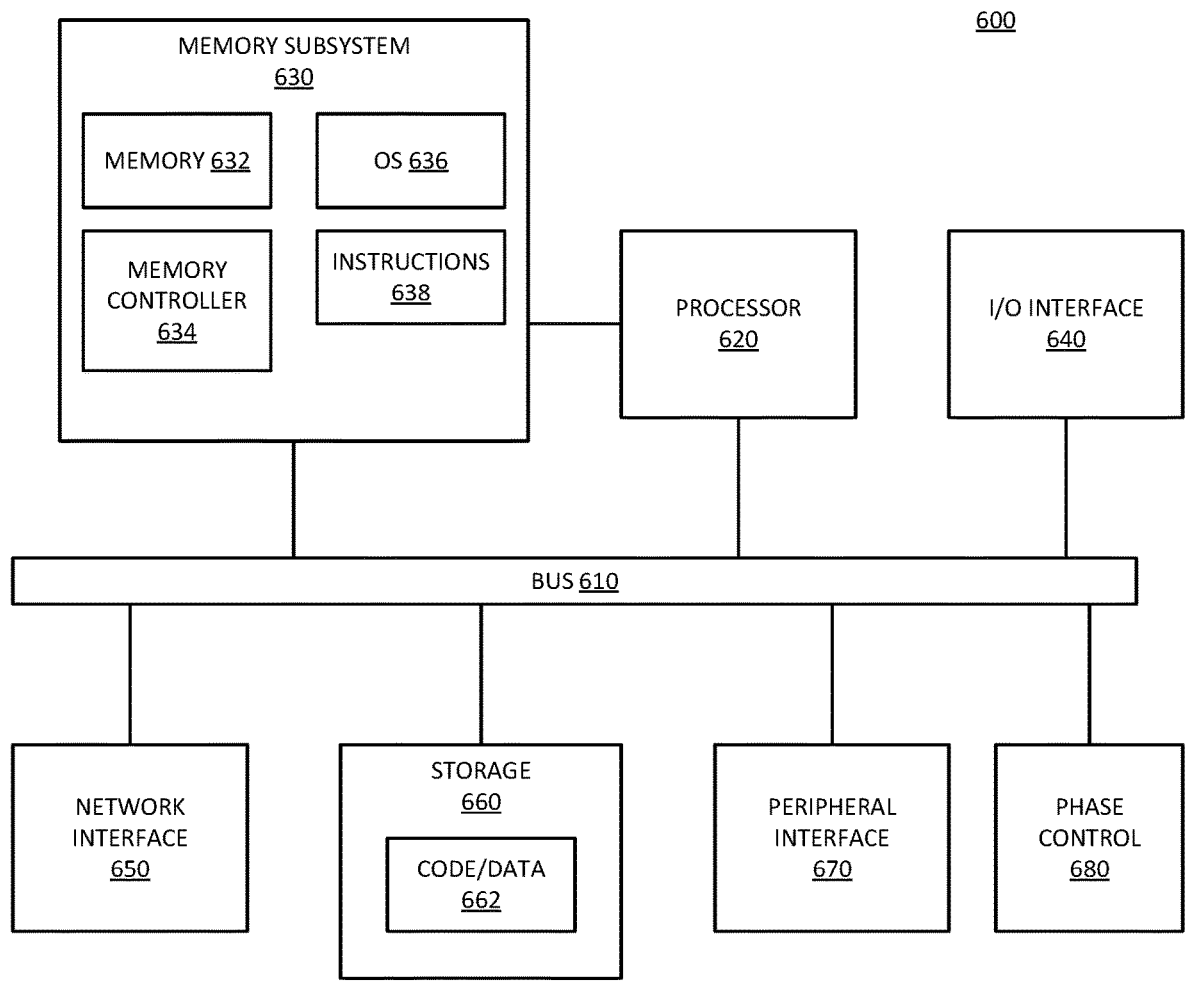
FIG. 6 is a block diagram of an embodiment of a computing system in which I/O phase delay control with varying slope can be implemented.

FIG. 6 is a block diagram of an embodiment of a computing system in which I/O phase delay control with varying slope can be implemented. System 600 represents a computing device in accordance with any embodiment described herein, and can be a laptop computer, a desktop computer, a server, a gaming or entertainment control system, a scanner, copier, printer, routing or switching device, or other electronic device. System 600 includes processor 620, which provides processing, operation management, and execution of instructions for system 600. Processor 620 can include any type of microprocessor, central processing unit (CPU), processing core, or other processing hardware to provide processing for system 600. Processor 620 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 can include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620. Memory subsystem 630 includes memory device 632 where it stores data, instructions, programs, or other items. In one embodiment, memory subsystem includes memory controller 634, which is a memory controller to generate and issue commands to memory device 632. It will be understood that memory controller 634 could be a physical part of processor 620.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 can also correspond to interfaces in network interface 650.

System 600 also includes one or more input/output (I/O) interface(s) 640, network interface 650, one or more internal mass storage device(s) 660, and peripheral interface 670 coupled to bus 610. I/O interface 640 can include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 can include an Ethernet adapter, wireless interconnection components, USB (universal serial bus), or other wired or wireless standards-based or proprietary interfaces.

Storage 660 can be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 can be generically considered to be a "memory," although memory 630 is the executing or operating memory to provide instructions to processor 620. Whereas storage 660 is nonvolatile, memory 630 can include volatile memory (i.e., the value or state of the data is indeterminate if power is interrupted to system 600).

Peripheral interface 670 can include any hardware interface not specifically mentioned above. Peripherals refer generally to devices that connect dependently to system 600. A dependent connection is one where system 600 provides the software and/or hardware platform on which operation executes, and with which a user interacts.

In one embodiment, system 600 includes phase control 680. Phase control 680 can be included in an I/O phase compensation circuit to lock I/O with a clock signal, such as in memory subsystem 630. In one embodiment, phase control 680 provides variable, programmable delay for I/O phase compensation. In one embodiment, the programmable slope is provided by dividing a coarse lock code and tracking and locking with finer phase adjustments. In one embodiment, the phase control includes a state machine with linear code control to control the operation of phase compensation.

Figure 7:
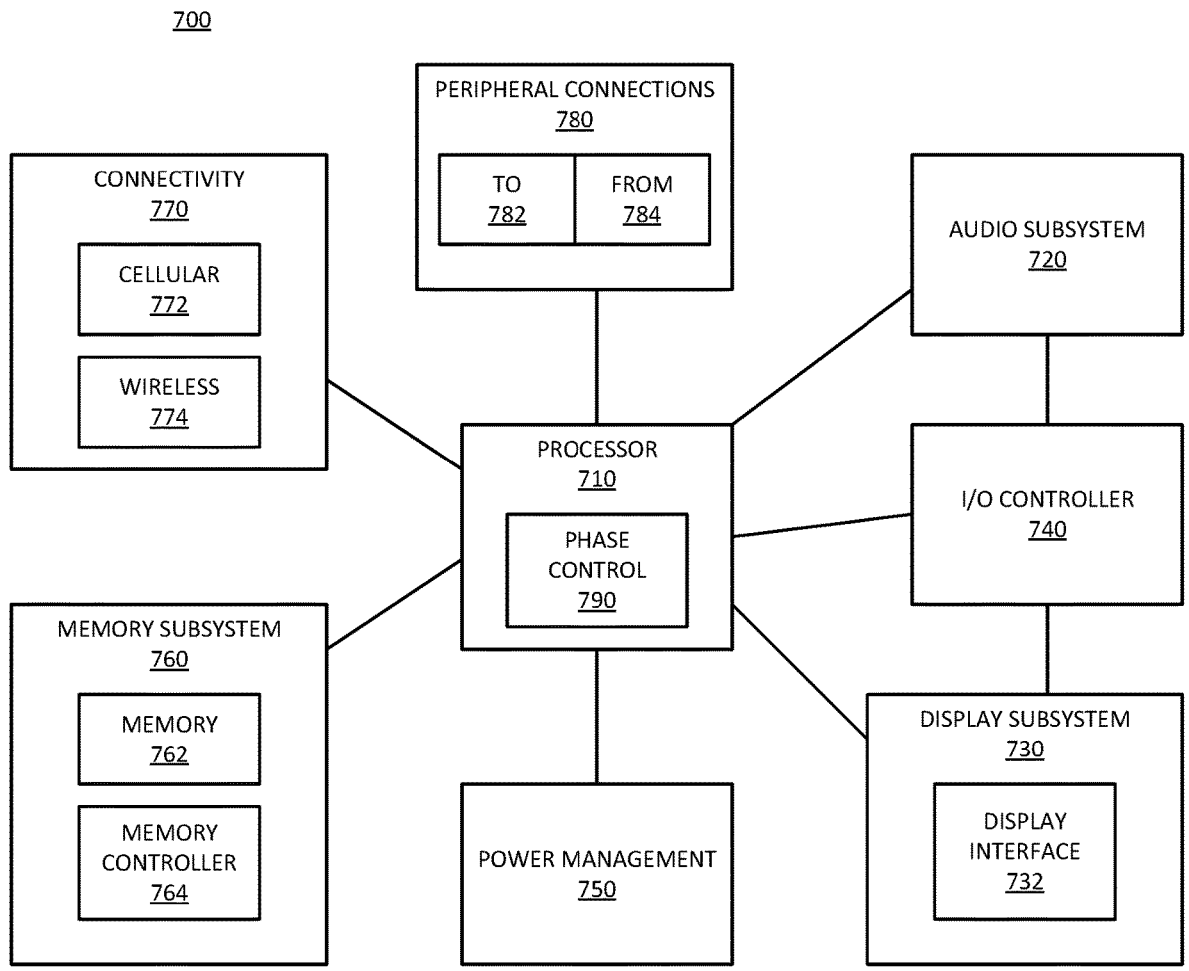
FIG. 7 is a block diagram of an embodiment of a mobile device in which I/O phase delay control with varying slope can be implemented.

FIG. 7 is a block diagram of an embodiment of a mobile device in which I/O phase delay control with varying slope can be implemented. Device 700 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user. In one embodiment, display subsystem 730 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device(s) 762 for storing information in device 700. Memory subsystem 760 can include nonvolatile (state does not change if power to the memory device is interrupted) and/or volatile (state is indeterminate if power to the memory device is interrupted) memory devices. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 includes a scheduler to generate and issue commands to memory device 762.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, system 700 includes phase control 790. Phase control 790 can be included in an I/O phase compensation circuit to lock I/O with a clock signal, such as in memory subsystem 760. In one embodiment, phase control 680 provides variable, programmable delay for I/O phase compensation. In one embodiment, the programmable slope is provided by dividing a coarse lock code and tracking and locking with finer phase adjustments. In one embodiment, the phase control includes a state machine with linear code control to control the operation of phase compensation.

In one aspect, a method for phase compensation includes: generating a linear code to apply phase compensation to lock phase of an I/O (input/output) signal to a phase of a timing signal; selectively adjusting the linear code with a variable, programmable slope, where the slope defines how much phase compensation is applied per unit change in the linear code; and applying the adjusted linear code to a lock loop to lock the phase of the I/O signal to the phase of the timing signal.

In one embodiment, generating the linear code comprises generating the code from a linear digital counter. In one embodiment, selectively adjusting the linear code with the variable, programmable slope further comprises: adjusting the linear code from a preset value based on an initial condition. In one embodiment, selectively adjusting the linear code with the variable, programmable slope further comprises: initially applying a coarse code for phase adjustment; and changing slope from the coarse code to subdivide the coarse code adjustments into finer adjustments. In one embodiment, selectively adjusting the linear code with the variable, programmable slope further comprises: initially applying a coarse code for phase adjustment; and changing slope from the coarse code by bit shifting the coarse code. In one embodiment, the lock loop comprises a digital delay locked loop (DLL). In one embodiment, the DLL comprises a DLL for a data I/O interface of a memory device. In one embodiment, the lock loop comprises a phase locked loop (PLL).

In one aspect, an I/O (input/output) control circuit includes: an I/O signal line to receive an I/O signal; a state machine to generate a linear code to apply phase compensation to lock phase of the I/O signal to a phase of a timing signal, to selectively adjust the linear code with a variable, programmable slope, where the slope defines how much phase compensation is applied per unit change in the linear code, and to apply the adjusted linear code to a lock loop to lock the phase of the I/O signal to the phase of the timing signal.

In one embodiment, the state machine includes a linear digital counter to generate the code. In one embodiment, the state machine is to further: receive an initial condition input to identify a preset value starting point for the phase compensation; and adjust the linear code based on the initial condition. In one embodiment, the state machine is to further: initially apply a coarse code for phase adjustment; and change slope from the coarse code to subdivide the coarse code adjustments into finer adjustments. In one embodiment, the state machine is further to initially apply a coarse code for phase adjustment, and further comprising a bit shifter to bit shift the coarse code to change the slope. In one embodiment, the lock loop comprises a digital delay locked loop (DLL). In one embodiment, the DLL comprises a DLL for a data I/O interface of a memory device. In one embodiment, the lock loop comprises a phase locked loop (PLL).

In one aspect, a memory device includes: I/O (input/output) hardware configured to interface with I/O signal lines to exchange data when coupled with an associated memory controller; and an I/O (input/output) control circuit to generate a linear code to apply phase compensation to lock phase of an I/O signal to be sent to the memory controller to a phase of a timing signal, to selectively adjust the linear code with a variable, programmable slope, where the slope defines how much phase compensation is applied per unit change in the linear code, and to apply the adjusted linear code to a lock loop to lock the phase of the I/O signal to the phase of the timing signal.

In one embodiment, the state machine includes a linear digital counter to generate the code. In one embodiment, the I/O control circuit is to further: receive an initial condition input to identify a preset value starting point for the phase compensation; and adjust the linear code based on the initial condition. In one embodiment, the I/O control circuit is to further: initially apply a coarse code for phase adjustment; and change slope from the coarse code to subdivide the coarse code adjustments into finer adjustments. In one embodiment, the I/O control circuit is further to initially apply a coarse code for phase adjustment, and wherein the I/O control circuit further comprises a bit shifter to bit shift the coarse code to change the slope. In one embodiment, the lock loop comprises a digital delay locked loop (DLL).

In one aspect, a system with a memory subsystem with I/O (input/output) phase compensation includes: an I/O (input/output) control circuit for a data interface between a memory controller and a memory device, including: an I/O signal line to receive an I/O signal; a state machine to generate a linear code to apply phase compensation to lock phase of an input clock signal to a data signal, to selectively adjust the linear code with a variable, programmable slope, where the slope defines how much phase compensation is applied per unit change in the linear code, and to apply the adjusted linear code to a lock loop to lock the phase of the I/O signal to the phase of the timing signal; and a touchscreen display coupled to generate a display based on data accessed from the memory device. The system can include an I/O control circuit in accordance with any embodiment of the I/O control circuit or the memory device described above.

In one aspect, an article of manufacture comprising a computer readable storage medium having content stored thereon, which when accessed causes a machine to perform operations for phase compensation, including: generating a linear code to apply phase compensation to lock phase of an I/O (input/output) signal to a phase of a timing signal; selectively adjusting the linear code with a variable, programmable slope, where the slope defines how much phase compensation is applied per unit change in the linear code; and applying the adjusted linear code to a lock loop to lock the phase of the I/O signal to the phase of the timing signal.

The article of manufacture can cause a machine to perform operations to execute a method in accordance with any embodiment of the method described above.

In one aspect, an apparatus for phase compensation includes: means for generating a linear code to apply phase compensation to lock phase of an I/O (input/output) signal to a phase of a timing signal; means for selectively adjusting the linear code with a variable, programmable slope, where the slope defines how much phase compensation is applied per unit change in the linear code; and means for applying the adjusted linear code to a lock loop to lock the phase of the I/O signal to the phase of the timing signal. The apparatus can include means for performing operations to execute a method in accordance with any embodiment of the method described above.

In one aspect, a method for phase compensation includes: applying coarse phase adjustments to an I/O (input/output) synchronization signal until a phase of the synchronization signal exceeds a reference phase; and applying fine phase adjustments to the I/O synchronization signal after exceeding the reference phase, where the fine phase adjustments are subdivisions of a coarse phase adjustment, wherein each phase offset of a fine phase adjustment is smaller than a phase offset of a coarse phase adjustment; wherein a size of the phase offset of the fine phase adjustment is programmably adjustable.

In one embodiment, applying the coarse phase adjustments further comprises generating a linear code to apply phase compensation to lock phase of an I/O (input/output) signal to a phase of a timing signal. In one embodiment, applying the coarse phase adjustments further comprises generating a linear code from a linear digital counter. In one embodiment, the size of the phase offset defines how much phase compensation is applied per unit change in the linear code. In one embodiment, applying the fine phase adjustments comprises selectively adjusting the course adjustments with variable, programmable phase offsets. In one embodiment, selectively adjusting the course adjustments with variable, programmable phase offsets further comprises: adjusting the phase offsets from a preset value based on an initial condition. In one embodiment, applying the fine phase adjustments comprises further comprises changing a size of the phase offsets by bit shifting a code controlling the phase offsets for the course phase adjustments. In one embodiment, applying the course phase adjustments and the fine phase adjustments comprises providing phase control in a digital delay locked loop (DLL). In one embodiment, the DLL comprises a DLL for a data I/O interface of a memory device. In one embodiment, applying the course phase adjustments and the fine phase adjustments comprises providing phase control in a phase locked loop (PLL).

In one aspect, an article of manufacture comprising a computer readable storage medium having content stored thereon, which when accessed causes a machine to perform operations to execute a method for phase compensation in accordance with any embodiment of the directly preceding method. In one aspect, an apparatus for phase compensation includes means for performing operations to execute a method for phase compensation in accordance with any embodiment of the directly preceding method.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An I/O (input/output) control circuit, comprising:
an I/O (input/output) signal line to receive an input signal; and
a phase control circuit to align the input signal with a phase of an internal reference signal for an input signal subject to phase drift due to environmental conditions, wherein the phase control circuit is to adjust phase of the input signal based on a programmable linear decoder, the linear decoder to apply a coarse code to generate coarse delay adjustments to the phase of the input signal, and then to apply a fine code in parallel with the coarse code to generate fine delay adjustments to the phase of the input signal with a variable slope rate, where the fine code provides a subdivision of the coarse code, wherein each fine delay adjustment is to adjust the phase of the input signal by a smaller amount than a coarse delay adjustment, wherein the fine phase adjustment is programmably adjustable.

2. The I/O control circuit of claim 1, wherein the phase control circuit is to
receive an initial condition input to identify a preset value starting point for phase adjustment; and
adjust the variable slope based on the initial condition.

3. The I/O control circuit of claim 1, wherein the phase control circuit is to set the coarse code and apply the fine code to the set coarse code to subdivide the coarse delay adjustments into finer adjustments.

4. The I/O control circuit of claim 3, wherein the phase control circuit is to first shift the phase of the input signal with coarse delay adjustments, and subsequently shift the phase of the input signal with the fine delay adjustments based on the fine code as least significant bits (LSBs) applied to the coarse code.

5. The I/O control circuit of claim 1, wherein the phase control circuit comprises a bitwise XOR (exclusive OR) circuit to bitwise XOR M least significant bits (LSBs) of a digital counter with digital counter bit M to generate a fine code value that continuously increments to its maximum value, and then decrements to zero, and then repeats.

6. The I/O control circuit of claim 1, wherein the phase control circuit is to bit shift the coarse code of the linear decoder to adjust the phase of the input signal until an edge of the input signal crosses an edge of the internal reference signal.

7. The I/O control circuit of claim 1, wherein the phase control circuit comprises a digital delay locked loop (DLL).

8. The I/O control circuit of claim 7, wherein the DLL comprises a DLL for a data I/O interface of a memory device.

9. A memory device, comprising:
a memory array;
an I/O (input/output) signal line interface to receive an input signal for access to the memory array; and
a phase control circuit coupled to the I/O signal line interface to align the input signal with a phase of an internal reference signal for an input signal subject to phase drift due to environmental conditions, wherein the phase control circuit is to adjust phase of the input signal with a variable slope based on a programmable linear decoder, the linear decoder to apply a coarse code to generate coarse delay adjustments to the phase of the input signal, and then to apply a fine code in parallel with the coarse code to generate fine delay adjustments to the phase of the input signal with a variable slope rate, where the fine code provides a subdivision of the coarse code, wherein each fine delay adjustment is to adjust the phase of the input signal by a smaller amount than a coarse delay adjustment, wherein the fine phase adjustment is programmably adjustable.

10. The memory device of claim 9, wherein the phase control circuit is to
receive an initial condition input to identify a preset value starting point for phase adjustment; and
adjust the variable slope based on the initial condition.

11. The memory device of claim 9, wherein the phase control circuit is to set the coarse code and apply the fine code to the set coarse code to subdivide the coarse delay adjustments into finer adjustments.

12. The memory device of claim 11, wherein the phase control circuit is to first shift the phase of the input signal with coarse delay adjustments, and subsequently shift the phase of the input signal with the fine delay adjustments based on the fine code as least significant bits (LSBs) applied to the coarse code.

13. The memory device of claim 9, wherein the phase control circuit comprises a bitwise XOR (exclusive OR) circuit to bitwise XOR M least significant bits (LSBs) of a digital counter with digital counter bit M to generate a fine code value that continuously increments to its maximum value, and then decrements to zero, and then repeats.

14. The memory device of claim 9, wherein the phase control circuit is to bit shift the coarse code of the linear decoder to adjust the phase of the input signal until an edge of the input signal crosses an edge of the internal reference signal.

15. The memory device of claim 9, wherein the phase control circuit comprises a digital delay locked loop (DLL).

16. A method for phase compensation, comprising:
applying a coarse code to a linear decoder to generate coarse delay adjustments to a phase of an I/O (input/output) input signal until an edge of the I/O input signal crosses an edge of a reference signal; and
applying a fine code to a linear decoder in parallel with the coarse code to generate fine delay adjustments to the I/O input signal after the edge of the I/O input signal crosses the edge of the reference signal to generate fine delay adjustments to the phase of the I/O input signal with a variable slope rate, where the fine code provides a subdivision of the coarse code, wherein each fine delay adjustment is smaller than a coarse delay adjustment;
wherein the fine delay adjustment is programmably adjustable.

17. The method of claim 16, wherein applying the coarse code further comprises generating a linear code from a linear digital counter.

18. The method of claim 17, wherein the coarse code and the fine code provide different sizes of phase offset that define how much phase compensation is applied per unit change in the linear code.

19. The method of claim 16, wherein applying the fine code comprises selectively adjusting the coarse delay adjustments with variable, programmable phase offsets.

20. The method of claim 19, wherein selectively adjusting the coarse delay adjustments with variable, programmable phase offsets further comprises:
adjusting the phase offsets from a preset value based on an initial condition.

21. The method of claim 19, wherein applying the fine code comprises further comprises changing a size of the phase offsets by bit shifting a code controlling the phase offsets for the coarse delay adjustments.

22. The method of claim 16, wherein applying the coarse code and the fine code comprises providing phase control in a digital delay locked loop (DLL).

23. The method of claim 22, wherein the DLL comprises a DLL for a data I/O interface of a memory device.

24. The method of claim 16, wherein applying the coarse code and the fine code comprises providing phase control in a phase locked loop (PLL).

* * * * *